(12) United States Patent
Kim

(10) Patent No.: US 6,282,456 B1
(45) Date of Patent: *Aug. 28, 2001

(54) DIGITAL AUDIO PROCESSOR

(75) Inventor: Young-Ho Kim, Kwachon (KR)

(73) Assignee: Hyundai Electronic Industries Co., Ltd., Kyougki-Do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/889,193

(22) Filed: Jul. 8, 1997

(30) Foreign Application Priority Data

Nov. 27, 1996 (KR) ............................................. 1996-58086

(51) Int. Cl.[7] ........................ G06F 17/00; H03K 19/0175
(52) U.S. Cl. ................................. 700/94; 326/80; 326/81
(58) Field of Search ................................. 700/94; 326/83, 326/81; 327/443

(56) References Cited

U.S. PATENT DOCUMENTS 5,748,011 * 5/1998 Takahashi et al. ..................... 326/83

OTHER PUBLICATIONS

Lancaster, Don. CMOS Cookbook, Howard W. Sams & Co., Inc., pp. 214–15, Dec. 1997.*

* cited by examiner

Primary Examiner—Minsun Oh Harvey
Assistant Examiner—Xu Mei
(74) Attorney, Agent, or Firm—Morgan, Lewis & Bockius LLP

(57) ABSTRACT

A digital audio processor includes a first logic unit reversing an enable signal, second logic unit reversing a data signal, a third logic unit receiving output signals from the first and second logic unit and outputting a logical NOR result, a fourth logic unit receiving an output signal from the second logic unit and the enable signal, a 5V tolerant circuit receiving output signal from the third logic unit and outputting signals depending upon an input voltage of a pad, a fifth logic unit reversing output from the fourth logic unit, a PMOS transistor coupled to a supply voltage and receiving an output signal from the 5V tolerant circuit, and an NMOS transistor connected serially to the PMOS transistor and a ground voltage.

5 Claims, 3 Drawing Sheets

DIGITAL AUDIO PROCESSOR

This application claims the benefit of Korean Application No. 58086/1996, filed Nov. 27, 1996, which is hereby incorporated by reference.

BACKGROUND OF THE INVENTION

1. Field of the Invention

The present invention relates to a digital audio processor, and more particularly, to a digital audio processor using a 5V tolerant input/output circuit. Although the present invention is suitable for a wide-scope of applications, it is particularly suitable for effectively coping with a high voltage applied to semiconductor devices.

2. Discussion of the Related Art

As shown in FIG. 1, a conventional digital audio processor includes a pair of inverters 1, 2 respectively inverting an enable signal EN and a data signal D, a NOR gate 3 NORing output signals from the inverters 1, 2, a NAND gate 4 NANDing the output signal from the inverter 2 and the enable signal EN, a pair of inverters 5, 6 respectively inverting the output signals from the NOR gate 3 and the NAND gate 4 and outputting a PMOS gate signal PG and an NMOS gate signal NG, a PMOS transistor 7 and an NMOS transistor 8 serially connected with each other between a supply voltage Vcc and a ground voltage Vss and respectively receiving gate signals PG and NG from the respective inverters 5, 6, and a pair of inverters 9, 10 connected in series to an output node $D_{IN}$ and a pad PAD and sequentially inverting a signal applied to the pad PAD.

FIG. 2 is a cross-sectional view illustrating the PMOS transistor 7 and the NMOS transistor 8 in the conventional input/output circuit shown in FIG. 1.

The operation of the conventional input/output circuit as aforementioned will be now described with reference to the accompanying drawings.

Initially, when the enable signal EN remaining at a high level so that it becomes an output mode, the enable signal EN is inverted in the inverter 1. Simultaneously, the enable signal EN is also applied to an input terminal of the NAND gate 4. When a high level data signal D is applied, the data signal D is inverted in the inverter 2 and applied to the respective input terminals of the NOR gate 3 and the NAND gate 4.

The NOR gate 3 and the NAND gate 4 respectively output high level signals, and the inverters 5, 6 invert the high level signals and output signals to the PMOS gate signal PG of the PMOS transistor 7 and the NMOS gate signal NG of the NMOS transistor 8. Accordingly, the PMOS transistor 7 becomes turned on and the NMOS transistor 8 becomes turned off. As a result, the pad PAD is turned to a high level identical to the data signal D.

Next, when the enable signal EN and the data signal D are at a high level and a low level, respectively, the output signals from the NOR gate 3 and the NAND gate 4 become a low level. Then, both the PMOS gate signal PG of the PMOS transistor 7 and the NMOS gate signal NG become a low level. Therefore, the PMOS transistor 7 becomes turned off and the NMOS transistor 8 becomes turned on, so that the PAD becomes a low level identical to the data signal D.

On the other hand, when the enable signal EN remains at a low level so that it becomes an input mode, the enable signal EN is applied to an input terminal of the NAND gate 4 and at the same time inverted in the inverter 1.

The NOR gate 3 then outputs a low level signal irrespective of the level of the data signal D and the NAND gate 4 outputs a high level signal irrespective of the level of the data signal D. Thus, both the PMOS transistor 7 and the NMOS transistor 8 become turned off.

At this time, when a high level signal is applied to the pad PAD, an input signal $D_{IN}$ outputted from the inverters 9, 10 becomes a value identical to the pad PAD.

As shown in FIG. 2, the pad PAD is connected to both a P+ active serving as a drain of the PMOS transistor 7 and an N+ active serving as a drain of the NMOS transistor 8. For example, when the supply voltage Vcc is 3.3V, a source region P+ of the PMOS transistor 7 and an N-Well of the substrate also become 3.3V.

When the pad PAD is applied at 5V, the drain region P+ of the PMOS transistor 7 becomes 5V and the drain region P+ forms an N-Well in the substrate and a PN diode of the PMOS transistor 7 and is turned on in a forward direction. Accordingly, in accordance with the turned-on PN diode, the in the substrate N-Well in the substrate of the PMOS transistor 7 becomes 5V and is connected to the supply voltage Vcc through an N-Well Plug. As a result, since the input of the 5V PAD and the supply voltage Vcc at 3.3V become short-circuited, an error occurs in the operation of the MOS transistors. In other words, when the voltage at the pad PAD is higher than that of the supply voltage Vcc, the operation of MOS transistors become problematic.

SUMMARY OF THE INVENTION

Accordingly, the present invention is directed to a digital audio processor using a 5V tolerant input/output circuit that substantially obviates one or more of problems due to limitations disadvantages of the related art.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a 5V tolerant input/output circuit includes a pair of inverters for respectively inverting an enable signal and a data signal, a NOR gate for NORing respective output values of the inverters, a NAND gate for NANDing an output value of the inverter and the enable signal, a 5V tolerant circuit for receiving an output value of the NOR gate and preventing an electrical short between a pad and a supply voltage, when an input voltage to the pad becomes higher than the supply voltage, an inverter for inverting an output value of the NAND gate, and a PMOS transistor and an NMOS transistor connected serially between the supply voltage and a ground voltage for thereby receiving an output value of the 5V tolerant circuit via a respective gate thereof.

In another aspect of the present invention, a digital audio processor includes a first logic unit reversing an enable signal, second logic unit reversing a data signal, a third logic unit receiving output signals from the first and second logic unit and outputting a logical NOR result, a fourth logic unit receiving an output signal from the second logic unit and the enable signal, a 5V tolerant circuit receiving output signal from the third logic unit and outputting signals depending upon an input voltage of a pad, a fifth logic unit reversing output from the fourth logic unit, a PMOS transistor coupled to a supply voltage and receiving an output signal from the 5V tolerant circuit, and an NMOS transistor connected serially to the PMOS transistor and a ground voltage.

It is to be understood that both the foregoing general description and the following detailed description are exemplary and explanatory and are intended to provide further explanation of the invention as claimed.

DETAILED DESCRIPTION OF THE INVENTION

Reference will now be made in detail to the preferred embodiments of the present invention, examples of which are illustrated in the accompanying drawings.

Figure 1:
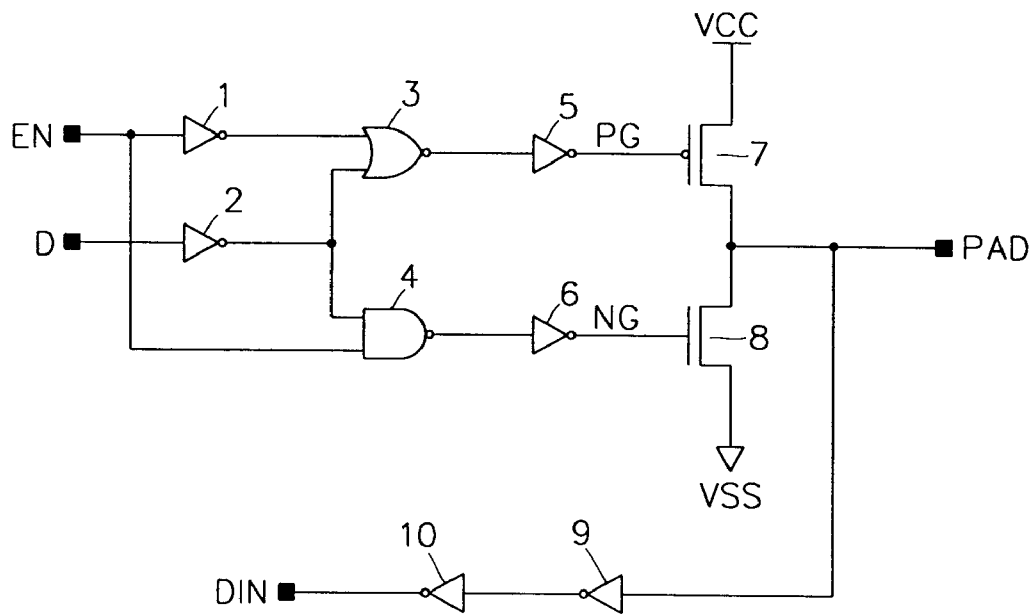
FIG. 1 is a circuit diagram of a conventional input/output circuit.
Figure 2:
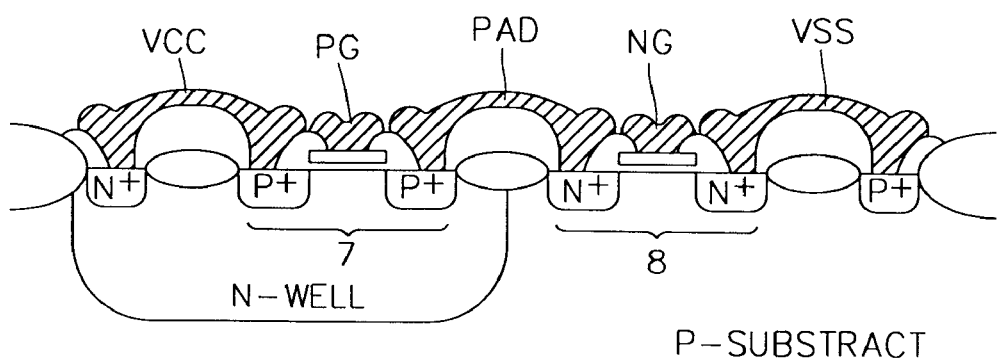
FIG. 2 is a cross-sectional view of a PMOS and an NMOS transistor of a conventional input/output circuit.
Figure 3:
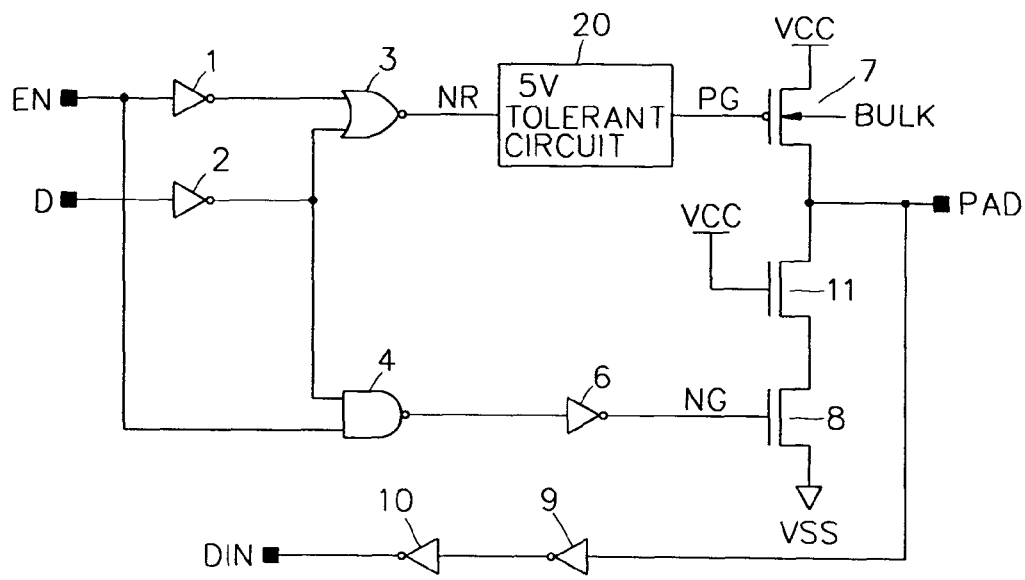
FIG. 3 is a circuit diagram of an input/output circuit according to a first embodiment of the present invention.

As illustrated in FIG. 3, in the 5V tolerant input/output circuit according to the present invention, the inverter 5 of the conventional input/output circuit in FIG. 1 is replaced by a 5V tolerant circuit 20, and the output value PG of the 5V tolerant circuit 20 is applied to the gate of a PMOS transistor 7 and a bulk and the substrate of the PMOS transistor 7 are connected to each other. An NMOS transistor 11 which stays turned-on by a supply voltage is located between the PMOS transistor 7 and the NMOS transistor 8. For the purpose of explanation for FIG. 3, the reference numerals for the same parts as the conventional circuit is designated as the same number used in FIG. 1.

Figure 4:
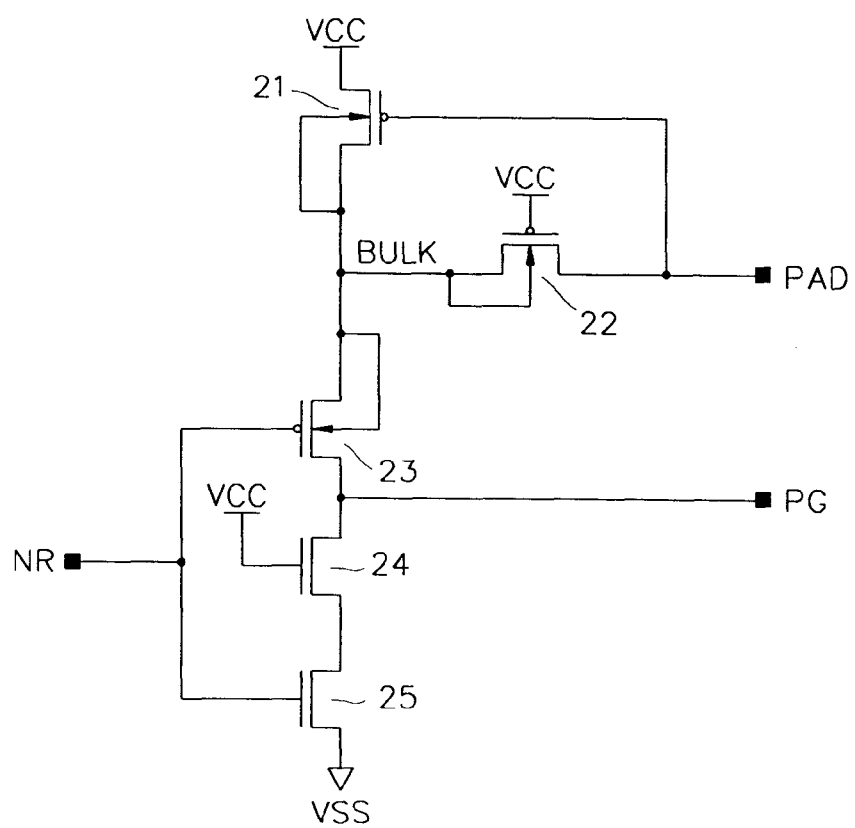
FIG. 4 is a detailed circuit diagram of a 5V tolerant circuit shown in FIG. 3.

As shown in FIG. 4, the 5V tolerant circuit 20 includes a PMOS transistor 21 having a source connected to a supply voltage Vcc, a gate connected to a pad PAD, and a drain and substrate connected to a bulk, a PMOS transistor 22 having a source connected to the pad PAD, a gate connected to the supply voltage Vcc, and a drain and substrate connected to the bulk, a PMOS transistor 23 having a source connected to the bulk, a gate connected to a NOR gate 3 and a drain connected to an output terminal, an NMOS transistor 24 having a drain connected to the output terminal and a gate connected to the supply voltage Vcc, and an NMOS transistor 25 having a drain connected to the source of the NMOS transistor 24, a gate connected to an output value NR of the NOR gate 3 and a source connected to a ground voltage Vss.

The operation of the 5V tolerant input/output circuit will now be described.

First, when an enable signal EN remains at a high level, that is, in an output mode when the data signal D a high level and the pad PAD remains at a low level, the output value NR of the NOR gate 3 becomes a high level.

Therefore, in accordance with high level output signal NR of the NOR gate 3, the PMOS transistor 23 of the 5V tolerant circuit 20 becomes turned off and the NMOS transistor 25 becomes turned on. A low level PMOS gate signal PG then is outputted through the output terminal.

Conversely, when the data signal D remains at a low level in an output mode, the output value NR of the NOR gate 3 becomes a low level so that the PMOS transistor 23 of the 5V tolerant circuit 20 is turned on. The high level PMOS gate signal PG thus is outputted through the PMOS transistors 21, 23 and the output terminal.

In other words, when the pad PAD becomes a low level and the input/output circuit remains in an output mode, the 5V tolerant circuit 20 is operated as an inverter. On the other hand, when the pad PAD remains at a high level equivalent to the supply voltage Vcc and in the output mode, the electric current is not generated between the substrate of the PMOS transistor 7 and the pad PAD.

When the enable signal EN is at a low level and in an input mode, the NOR gate 3 outputs a low level output signal NR irrespective of a level of the data signal D. Thus, the output value PG of the 5V tolerant circuit 20 is turned to a high level.

At this time, when the input voltage of the pad PAD becomes lower than the supply voltage Vcc, the PMOS transistor 22 is turned off and the PMOS transistor 21 is turned on. The PMOS transistor 23 is then turned on by the low level output signal NR of the NOR gate 3 so that the output value PG of the 5V tolerant circuit 20 becomes a supply voltage Vcc.

When the input voltage of the pad PAD is 5V, which is higher than the supply voltage Vcc, and the pad voltage becomes higher than the value of Vcc+Vtp, the PMOS transistor 22 is turned on and a pad voltage is applied to the bulk. Here, Vtp denotes a threshold voltage of the PMOS transistor 22.

Accordingly, since the PMOS transistor 23 is turned on, the bulk voltage identical to the pad voltage becomes an output signal PG of the 5V tolerant circuit 20.

Eventually, when the PMOS transistor 7 is turned off, the substrate of the PMOS transistor 7 is connected to the bulk. Thus, there is no electrical current between the substrate of the PMOS transistor 7 and the pad PAD.

Figure 5:
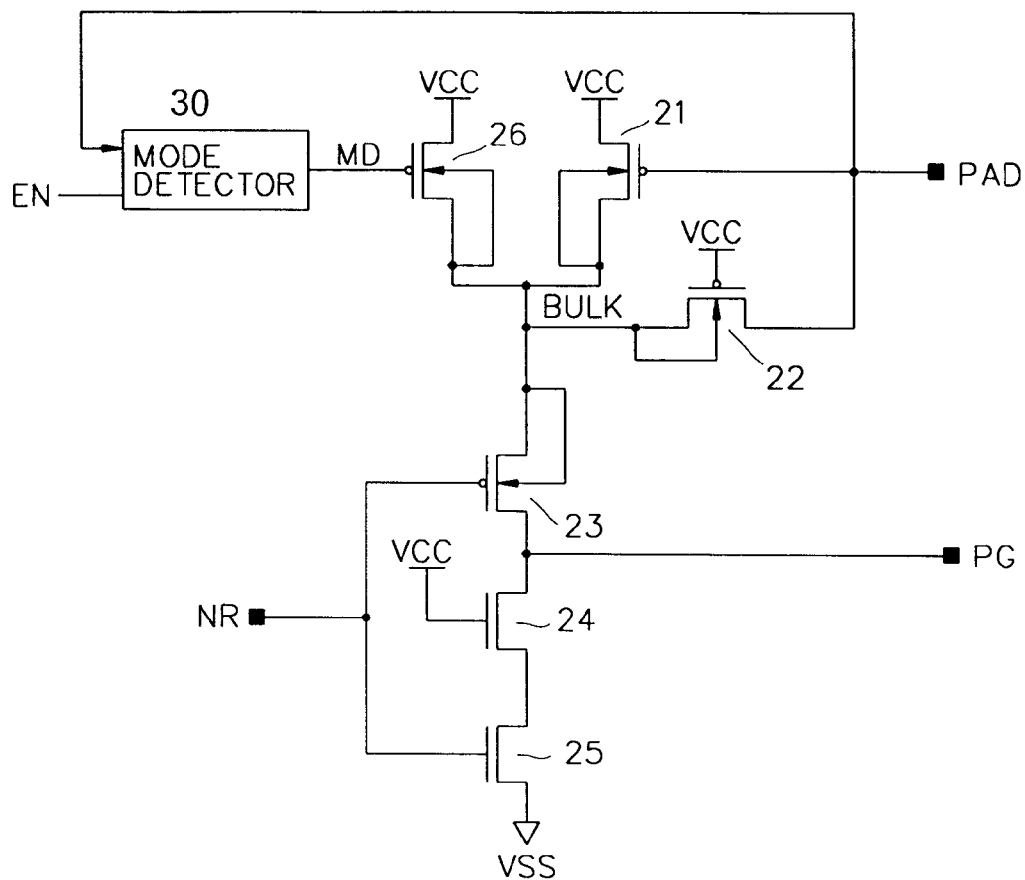
FIG. 5 is a detailed circuit diagram of a 5V tolerant circuit shown in FIG. 4 according to a second embodiment of the present invention.

The 5V tolerant circuit 20 according to a second embodiment of the present invention further includes a mode detector 30 in addition to the circuit shown in FIG. 4. As shown in FIG. 5, the 5V tolerant circuit includes the mode detector 30 receiving and detecting an enable signal EN in order to prevent the bulk from a floating state when the PMOS transistor 21 is turned off in the 5V tolerant circuit 20, a PMOS transistor 26 having source connected to the supply voltage Vcc, a gate connected to the output value MD of the mode detector 30, and a drain and substrate connected to the bulk.

Figure 6:
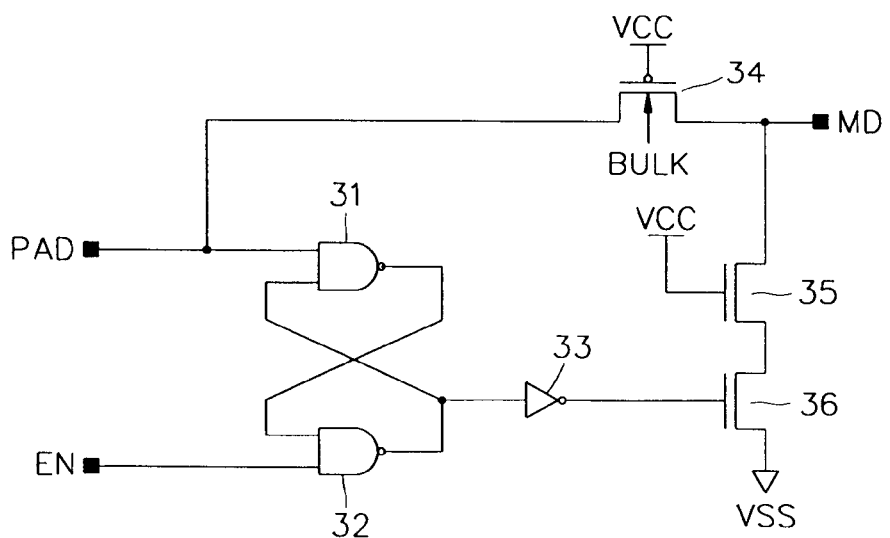
FIG. 6 is a detailed circuit diagram of a mode detector shown in FIG. 5.

The mode detector 30, as shown in FIG. 6, includes a NAND gate 31 having an input from a pad PAD, a NAND gate 32 receiving an enable signal EN through a terminal thereof and the output value of the NAND gate 31 through another terminal thereof, an inverter 33 inverting the output value of the NAND gate 32, a PMOS transistor 34 having a gate connected to the supply voltage Vcc, a source connected to the pad PAD, a drain connected to the output terminal, and a substrate connected to the bulk, the NMOS transistor 35 having gate connected to the supply voltage Vcc, and a drain connected to the output terminal, and the NMOS transistor 36 having a drain connected to the source of the NMOS transistor 35, a gate connected to the output value of the inverter 33, and a source connected to the ground voltage.

The operation of the 5V tolerant input/output circuit according to the present invention will now be described.

When the enable signal EN remains at a high level so that it is in an output mode, the pad PAD is also at a high level and equivalent to the supply voltage Vcc. In turn, since the PMOS transistor 21 becomes turned off, the bulk is in a floating state.

At this time, when the pad PAD reaches around the supply voltage Vcc, the PMOS transistor 34 of the mode detector 30 becomes turned off and the output signal of the NAND gate 31 is turned to a high level. Also, since the output signal of the NAND gate 32 is turned to a low level, the PMOS transistor 36 is turned on and stabilizes a bulk voltage.

As described above, the 5V tolerant input/output circuit of the present invention prevent an electrical short-circuit between a pad and a supply voltage by equalizing the voltage of a substrate of a PMOS transistor and a bulk to a pad voltage when a pad input voltage becomes higher than the supply voltage. The voltage of the substrate and bulk remains identical to that of a pad voltage by blocking the current path when an external voltage higher than a supply voltage is applied to a semiconductor chip. Accordingly, since an error operation of the MOS transistors is eliminated, an exact operation in an output mode is achieved by maintaining the voltage of the substrate from the output operating transistors the same level as the supply voltage.

What is claimed is:

1. A digital audio processor comprising:
    a first logic unit reversing an enable signal;
    a second logic unit reversing a data signal;
    a third logic unit receiving output signals from the first logic unit and second logic unit and outputting a logical NOR result;
    a fourth logic unit receiving an output signal from the second logic unit and the enable signal, and outputting a logical NAND result;
    a 5V tolerant circuit receiving an output signal from the third logic unit and outputting signals depending upon an input voltage of a pad, the 5V tolerant circuit consisting of three PMOS transistors and two NMOS transistors, wherein a PMOS transistor, which has a gate that receives the logical NOR result from the third logic unit, has a drain which is directly connected to a source of a PMOS transistor, which has a gate that receives a supply voltage;
    a fifth logic unit reversing an output from the fourth logic unit;
    a first PMOS transistor coupled to the supply voltage and receiving an output signal from the 5V tolerant circuit, wherein the first PMOS transistor having a gate receiving the signals from the 5V tolerant circuit and a substrate connected to a bulk, so that when the first PMOS transistor is turned off, there is no current between the substrate and the pad; and
    a first NMOS transistor connected serially to the first PMOS transistor and a ground voltage.

2. The processor according to claim 1, wherein the 5V tolerant circuit is operated to prevent an electrical short-circuit between the pad and the supply voltage when the input voltage of the pad becomes higher than the supply voltage.

3. The processor according to claim 1, wherein the 5V tolerant circuit comprises:
    a second PMOS transistor having a source connected to the supply voltage, a gate connected to the pad, and a drain and substrate connected to a bulk;
    a third PMOS transistor having a source connected to the pad, a gate connected to the supply voltage, and a drain and substrate connected to the bulk;
    a fourth PMOS transistor having a source connected to the bulk, a gate connected to the third logic, unit and a drain connected to an output terminal;
    a second NMOS transistor having a drain connected to the output terminal, and a gate connected to the supply voltage; and
    a third NMOS transistor having a drain connected to the source of the second NMOS transistor, a gate connected to the third logic unit and a source connected to the ground voltage.

4. A digital audio processor comprising:
    a first logic unit reversing an enable signal;
    a second logic unit reversing a data signal;
    a third logic unit receiving output signals from the first logic unit and second logic unit and outputting a logical NOR result;
    a fourth logic unit receiving an output signal from the second logic unit and the enable signal, and outputting a logical NAND result;
    a fifth logic unit reversing an output from the fourth logic unit;
    a 5V tolerant circuit receiving an output signal from the third logic unit and outputting signals depending upon an input voltage of a pad, the 5V tolerant circuit consisting of four PMOS transistors, two NMOS transistors, and a mode detector consisting of three logic units, one PMOS transistor and two NMOS transistors;
    a first PMOS transistor coupled to a supply voltage and receiving an output signal from the 5V tolerant circuit, wherein the first PMOS transistor having a gate receiving the signals from the 5V tolerant circuit and a substrate connected to a bulk, so that when the first PMOS transistor is turned off, there is no current between the substrate and the pad;
    a first NMOS transistor connected serially to the PMOS transistor and a ground voltage;
    a second NMOS transistor receiving an output from the fifth logic unit;
    a sixth logic unit reversing an output signal from the pad; and
    a seventh logic unit reversing an output signal from the sixth logic unit.

5. The processor according to claim 4, wherein the mode detector comprises:
    an eighth logic unit receiving an output signal from the pad, and outputting a first logical NAND result;
    a ninth logic unit receiving an enable signal and an output signal from the eighth logic unit, and outputting a second logical NAND result;
    a tenth logic unit reversing output signals from the ninth logic unit;
    a sixth PMOS transistor having a gate connected to the supply voltage, a source connected to the pad, a drain connected to the output terminal, and the substrate connected to the bulk;
    a fourth NMOS transistor having a gate connected to the supply voltage, and a drain connected to the output terminal; and
    a fifth NMOS transistor having a drain connected to the source of the fourth NMOS transistor, a gate connected to an output terminal of the ninth logic unit, and a source connected to the ground voltage.

* * * * *